United States Patent
Xu

(10) Patent No.: US 8,466,044 B2
(45) Date of Patent: Jun. 18, 2013

(54) MEMORY CELL THAT INCLUDES A CARBON-BASED MEMORY ELEMENT AND METHODS FORMING THE SAME

(75) Inventor: Huiwen Xu, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 423 days.

(21) Appl. No.: 12/536,457

(22) Filed: Aug. 5, 2009

(65) Prior Publication Data

US 2010/0032638 A1 Feb. 11, 2010

Related U.S. Application Data

(60) Provisional application No. 61/087,164, filed on Aug. 7, 2008.

(51) Int. Cl.
  *H01L 21/20* (2006.01)
(52) U.S. Cl.
  USPC 438/478; 257/40; 257/E21.211; 257/E45.002; 257/E51.04; 257/E29.001
(58) Field of Classification Search
  USPC ........... 257/2–5, E21.211, E45.002; 365/148; 438/697; 977/742
  See application file for complete search history.

(56) References Cited

U.S. PATENT DOCUMENTS

| | | |
|---|---|---|
| 5,629,666 A | 5/1997 | Imai et al. |
| 5,915,167 A | 6/1999 | Leedy |
| 6,333,016 B1 | 12/2001 | Resasco et al. |
| 6,420,092 B1 | 7/2002 | Yang |
| 6,515,325 B1 | 2/2003 | Farnworth et al. |
| 6,706,402 B2 | 3/2004 | Rueckes |
| 6,833,558 B2 | 12/2004 | Lee et al. |
| 6,863,942 B2 | 3/2005 | Ren et al. |
| 6,885,021 B2 | 4/2005 | Apodaca et al. |
| 6,919,592 B2 | 7/2005 | Segal et al. |
| 6,952,030 B2 | 10/2005 | Herner et al. |
| 6,969,651 B1 | 11/2005 | Lu et al. |
| 6,986,877 B2 | 1/2006 | Takikawa et al. |
| 7,056,758 B2 | 6/2006 | Segal et al. |
| 7,084,062 B1 | 8/2006 | Avanzino et al. |
| 7,176,064 B2 | 2/2007 | Herner |
| 7,224,033 B2 | 5/2007 | Zhu et al. |

(Continued)

FOREIGN PATENT DOCUMENTS

| | | |
|---|---|---|
| EP | 1 361 608 | 11/2003 |
| EP | 1 739 753 | 1/2007 |

(Continued)

OTHER PUBLICATIONS machine translation of JP 2006/063369.*

(Continued)

*Primary Examiner* — Julio J Maldonado
*Assistant Examiner* — Sonya D McCall Shepard
(74) *Attorney, Agent, or Firm* — Dugan & Dugan, PC

(57) ABSTRACT

Memory cells, and methods of forming such memory cells, are provided that include a carbon-based reversible resistivity switching material. In particular embodiments, methods in accordance with this invention form a memory cell by forming a carbon-based reversible resistance-switching material above a substrate, forming a carbon nitride layer above the carbon-based reversible resistance-switching material, and forming a barrier material above the carbon nitride layer using an atomic layer deposition process. Other aspects are also provided.

56 Claims, 13 Drawing Sheets

U.S. PATENT DOCUMENTS

| | | |
|---|---|---|
| 7,285,464 B2 | 10/2007 | Herner et al. |
| 7,301,191 B1 | 11/2007 | Tombler et al. |
| 7,345,296 B2 | 3/2008 | Tombler, Jr. et al. |
| 7,374,987 B2 | 5/2008 | Chidambarrao et al. |
| 7,390,726 B1 | 6/2008 | Issaq et al. |
| 7,405,465 B2 | 7/2008 | Herner |
| 7,483,285 B2 | 1/2009 | Furukawa et al. |
| 7,560,136 B2 | 7/2009 | Ward et al. |
| 7,575,984 B2 | 8/2009 | Radigan |
| 7,615,432 B2 | 11/2009 | Kim et al. |
| 7,618,300 B2 | 11/2009 | Liu et al. |
| 7,768,016 B2 | 8/2010 | Kreupl |
| 2003/0021966 A1 | 1/2003 | Segal et al. |
| 2003/0073295 A1 | 4/2003 | Xu |
| 2003/0222560 A1 | 12/2003 | Roach |
| 2004/0159835 A1 | 8/2004 | Krieger et al. |
| 2005/0019494 A1* | 1/2005 | Moghadam et al. ..... 427/255.32 |
| 2005/0052915 A1 | 3/2005 | Herner et al. |
| 2005/0148271 A1 | 7/2005 | Yaniv et al. |
| 2005/0226067 A1 | 10/2005 | Herner et al. |
| 2006/0038212 A1 | 2/2006 | Moore et al. |
| 2006/0097342 A1 | 5/2006 | Parkinson |
| 2006/0234418 A1 | 10/2006 | Ufert |
| 2006/0250836 A1 | 11/2006 | Herner |
| 2006/0269692 A1 | 11/2006 | Balseanu et al. |
| 2007/0020919 A1 | 1/2007 | Adem et al. |
| 2007/0128858 A1 | 6/2007 | Haukka |
| 2007/0190722 A1 | 8/2007 | Herner |
| 2007/0200243 A1* | 8/2007 | Kraus et al. ................ 257/763 |
| 2007/0221998 A1 | 9/2007 | Park |
| 2007/0252131 A1 | 11/2007 | Tong et al. |
| 2007/0268042 A1 | 11/2007 | Paul |
| 2007/0269992 A1 | 11/2007 | Yang et al. |
| 2008/0026523 A1 | 1/2008 | Lee et al. |
| 2008/0061283 A1 | 3/2008 | Taguchi |
| 2008/0070162 A1 | 3/2008 | Ufert |
| 2008/0099752 A1 | 5/2008 | Kreupl et al. |
| 2008/0101121 A1 | 5/2008 | Kreupl |
| 2008/0107892 A1 | 5/2008 | Jiao et al. |
| 2008/0135834 A1 | 6/2008 | Kaza et al. |
| 2008/0173858 A1 | 7/2008 | An et al. |
| 2008/0210923 A1 | 9/2008 | Sato |
| 2008/0230826 A1 | 9/2008 | Das |
| 2008/0233396 A1 | 9/2008 | Raravikar |
| 2008/0237599 A1 | 10/2008 | Herner et al. |
| 2008/0237733 A1 | 10/2008 | Chen et al. |
| 2008/0239790 A1 | 10/2008 | Herner |
| 2008/0308785 A1* | 12/2008 | Park et al. ..................... 257/4 |
| 2009/0017640 A1* | 1/2009 | Huh et al. ................... 438/783 |
| 2009/0166609 A1 | 7/2009 | Schricker |
| 2009/0166610 A1 | 7/2009 | Schricker |
| 2009/0168491 A1 | 7/2009 | Schricker |
| 2009/0213643 A1 | 8/2009 | Angerbauer et al. |
| 2009/0225588 A1* | 9/2009 | Czubatyj et al. .............. 365/163 |
| 2009/0263972 A1 | 10/2009 | Balseanu et al. |
| 2009/0278112 A1 | 11/2009 | Schricker et al. |
| 2009/0283735 A1 | 11/2009 | Li et al. |
| 2010/0001267 A1 | 1/2010 | Manning et al. |
| 2010/0006812 A1 | 1/2010 | Xu |
| 2010/0008122 A1* | 1/2010 | Tilke ............................ 365/148 |
| 2010/0012912 A1* | 1/2010 | Schricker ......................... 257/2 |
| 2010/0019317 A1 | 1/2010 | Moroz et al. |
| 2010/0032638 A1 | 2/2010 | Xu |
| 2010/0032643 A1 | 2/2010 | Xu |
| 2010/0078759 A1 | 4/2010 | Sekar et al. |
| 2010/0102291 A1 | 4/2010 | Xu |
| 2010/0117041 A1 | 5/2010 | Hwang et al. |
| 2010/0245029 A1 | 9/2010 | Schricker et al. |
| 2011/0254126 A1 | 10/2011 | Kreupl et al. |

FOREIGN PATENT DOCUMENTS

| | | |
|---|---|---|
| EP | 1 892 722 | 2/2008 |
| EP | 1 916 722 | 4/2008 |
| WO | WO 2004/070735 | 8/2004 |
| WO | WO 2005/045871 | 5/2005 |
| WO | WO 2006/049834 A1 | 5/2006 |
| WO | WO 2006/078505 A2 | 7/2006 |
| WO | WO 2006/079979 | 8/2006 |
| WO | WO 2007/130913 A2 | 11/2007 |
| WO | WO 2008/021900 A2 | 2/2008 |
| WO | WO 2008/036385 | 3/2008 |
| WO | WO 2009/088889 A | 7/2009 |
| WO | WO 2009/088890 A | 7/2009 |
| WO | WO 2009/137222 A2 | 11/2009 |
| WO | WO 2010/017427 A1 | 2/2010 |
| WO | WO 2010/048408 A2 | 4/2010 |

OTHER PUBLICATIONS

Machine Translation of JP 2006/063369 (Sep. 3, 2006).*
Partial International Search of counterpart International Patent Application No. PCT/US2009/053057 mailed Oct. 26, 2009.
Invitation to Pay Additional Fees in counterpart International Patent Application No. PCT/US2009/053057 mailed Oct. 26, 2009.
International Search Report and Written Opinion of counterpart International Patent Application No. PCT/US2009/053057 mailed Dec. 10, 2009.
Ping et al., U.S. Appl. No. 12/608,607, filed Oct. 29, 2009.
Jayasekara, U.S. Appl. No. 12/608,592, filed Oct. 29, 2009.
Budnik et al., "A High Density, Carbon Nanotube Capacitor for Decoupling Applications", DAC 2006, Jul. 24-28, 2006, pp. 935-938.
Engelsen, "The temptation of field emission displays", Physics Procedia 1 (2008), pp. 355-365.
Leroy et al., "Thin film solid-state reactions forming carbides as contact materials for carbon-containing semiconductors", Journal of Applied Physics, vol. 101, No. 5, (2007) pp. 053714-1-053714-10.
Gerstner et al., "Nonvolatile Memory Effects in Nitrogen Doped Tetrahedral Amorphous Carbon Thin Films", Nov. 15, 1998, Journal of Applied Physics, vol. 84, No. 10, pp. 5647-5651.
Takai et al.,"Structure and Electronic Properties of a Nongraphitic Disordered Carbon System and its Heat-Treatment Effects", 2003, Physical Review B 67, 214202, pp. 214202-1-214202-11.
Bhattacharyya, et al., "Resonant Tunnelling and Fast Switching in Amorphous-Carbon Quantum-Well Structures," Dec. 2005, Nanoelectronics Centre, Advanced Technology Institute, pp. 19-22.
Dittmer et al., "Low ambient temperature CVD growth of carbon nanotubes," Appl. Phys. A 84, 2006, p. 1.
Kodama et al., "Properties of Amorphous Carbon Films Synthesized by Atmospheric Pressure Glow Plasma CVD Method," Journal of Photopolymer Science and Technology, vol. 19, No. 5, 2006, pp. 673-678.
Kong et al., "Integration of a gate electrode into carbon nanotube devices for scanning tunneling microscopy," Appl. Phys. Lett. 86, 2005, pp. 112106-1-112106-3.
Bhattacharyya, et al., "Switching behaviour and high frequency response of amorphous carbon double-barrier structures" Aug. 2007, Materials Science and Engineering C, Elsevier Science S.A, CH, vol. 27 No. 5-8, pp. 957-960.
Xu et al., U.S. Appl. No. 12/465,315, filed May 13, 2009.
Schricker et al., U.S. Appl. No. 12/421,405, filed Apr. 9, 2009.
Jayasekara et al., U.S. Appl. No. 12/408,419, filed Mar. 20, 2009.
Li et al., U.S. Appl. No. 13/416,135, filed Mar. 9, 2012.
Robertson, J., "Diamond-like amorphous carbon", 2002, Materials Science and Engineering, R 37, pp. 129-281.
Kanicki, J, "Role of Hydrogen in silicon nitride films prepared by various deposition techniques", 1988, MRS Proceedings 118, 671.
Murarka, S.P., et al. "Effect of Growth Parameters on the CVD of Boron Nitride and Phosphorus-Doped Boron Nitride." J. Electrochem. Soc.:Sol.-State Sci. & Technol., vol. 126, No. 11 (1979) pp. 1951-1957.
Grill, "Plasma-deposited Diamondlike Carbon and Related Materials", Jan./Mar. 1999; IBM J. Res. Develop. vol. 43 No. 1/2, pp. 147-162.
Xu, U.S. Appl. No. 12/780,564, filed May 14, 2010.

* cited by examiner

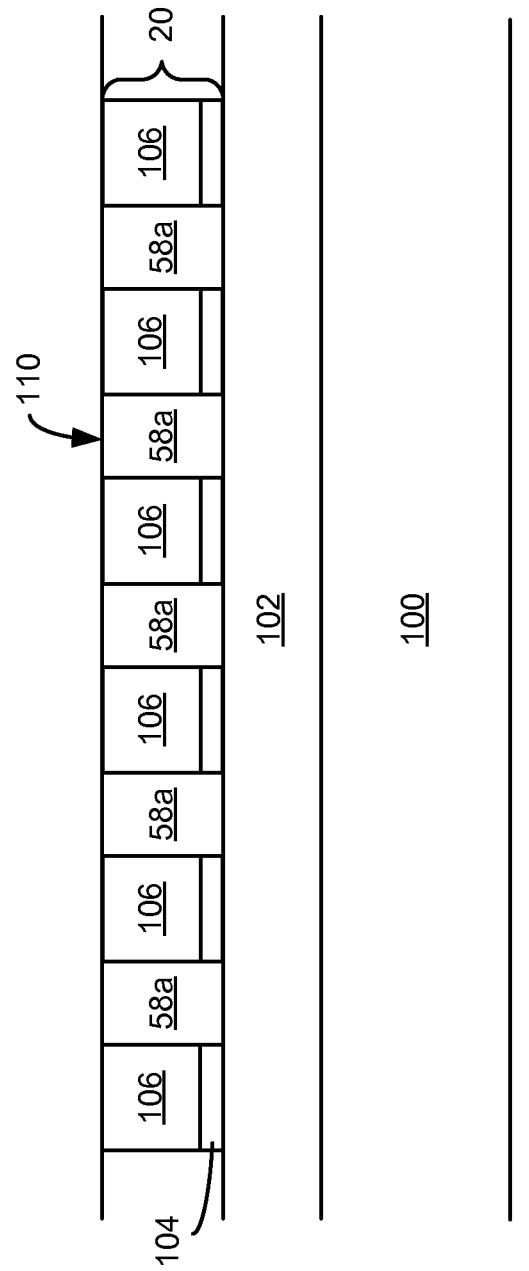

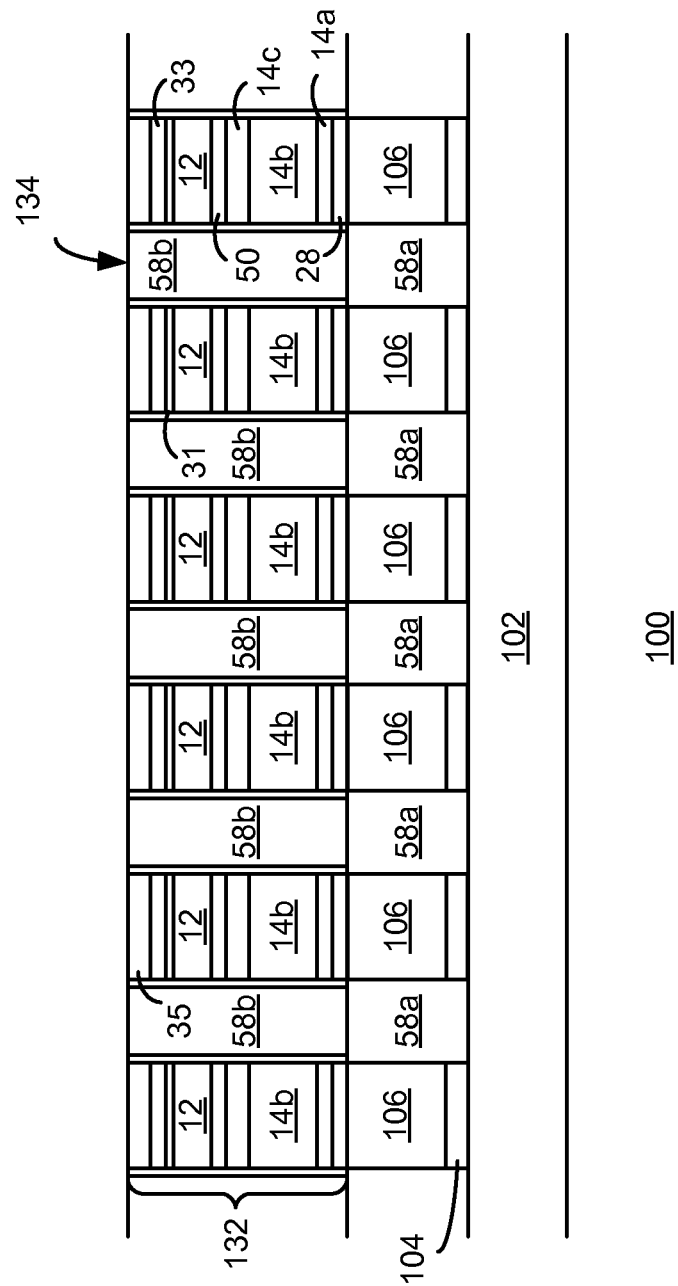

US 8,466,044 B2

MEMORY CELL THAT INCLUDES A CARBON-BASED MEMORY ELEMENT AND METHODS FORMING THE SAME

CROSS-REFERENCE TO RELATED APPLICATIONS

This application claims the benefit of U.S. Provisional Patent Application Ser. No. 61/087,164, filed Aug. 7, 2008, "Methods And Apparatus For Forming Memory Cells Using Carbon Read Writable Materials," which is hereby incorporated by reference herein in its entirety for all purposes.

TECHNICAL FIELD

This invention relates to non-volatile memories, and more particularly to a memory cell that includes a carbon-based memory element, and methods of forming the same.

BACKGROUND

Non-volatile memories formed from reversible resistance switching elements are known. For example, U.S. patent application Ser. No. 11/968,154, filed Dec. 31, 2007, titled "Memory Cell That Employs A Selectively Fabricated Carbon Nano-Tube Reversible Resistance Switching Element And Methods Of Forming The Same" (the "'154 application"), which is hereby incorporated by reference herein in its entirety for all purposes, describes a rewriteable non-volatile memory cell that includes a diode coupled in series with a carbon-based reversible resistivity switching material.

However, fabricating memory devices from carbon-based materials is technically challenging, and improved methods of forming memory devices that employ carbon-based materials are desirable.

SUMMARY

In a first aspect of the invention, a method of forming a memory cell is provided, the method including forming a carbon-based reversible resistance-switching material above a substrate, forming a carbon nitride layer above the carbon-based reversible resistance-switching material, and forming a barrier material above the carbon nitride layer using an atomic layer deposition process.

In a second aspect of the invention, a method of forming a memory cell is provided, the method including forming a layer of a carbon-based reversible resistance-switching material above a substrate, patterning and etching the layer of carbon-based reversible resistance-switching to form a pillar comprising a sidewall, and forming a dielectric liner on the sidewall, wherein the dielectric liner comprises boron.

In a third aspect of the invention, a method of forming a memory cell is provided, the method including forming a layer of a carbon-based reversible resistance-switching material above a substrate, forming a barrier material above the carbon-based reversible resistance-switching material without substantially damaging the carbon-based reversible resistance-switching material, patterning and etching the barrier material and the layer of carbon-based reversible resistance-switching material to form a pillar comprising a sidewall, and forming a dielectric liner on the sidewall, wherein the dielectric liner comprises a leakage current density of less than about $10^{-8}$ A/cm$^2$ and a breakdown voltage greater than about 5 MV/cm.

Other features and aspects of the present invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which:

FIGS. 4A-4H illustrate cross-sectional views of a portion of a substrate during an exemplary fabrication of a single memory level in accordance with this invention.

DETAILED DESCRIPTION

Figure 1:
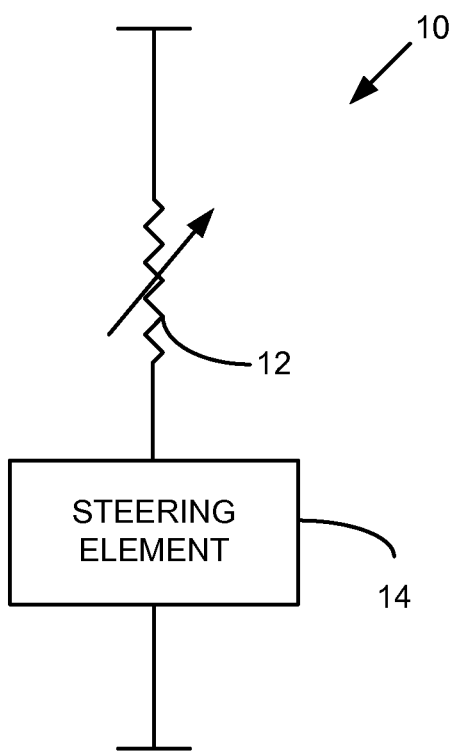
FIG. 1 is a diagram of an exemplary memory cell in accordance with this invention.

This invention provides interface layers that protect carbon-based materials from damage during subsequent processing steps. In one exemplary embodiment, a barrier layer is formed over the carbon-based material prior to forming a conductive layer on the carbon-based material. In a second exemplary embodiment, a conformal liner is formed on a sidewall of the carbon-based material prior to depositing a dielectric gap fill material around the carbon-based material.

Carbon films such as amorphous carbon ("aC") containing nanocrystalline graphene (referred to herein as "graphitic carbon"), graphene, graphite, carbon nano-tubes, amorphous diamond-like carbon ("DLC") (described below), silicon carbide, boron carbide and other similar carbon-based materials may exhibit resistivity-switching behavior that may make such materials suitable for use in microelectronic non-volatile memories.

Indeed, some carbon-based materials have demonstrated reversible resistivity-switching memory properties on lab-scale devices with a 100× separation between ON and OFF states and mid-to-high range resistance changes. Such a separation between ON and OFF states renders carbon-based materials viable candidates for memory cells formed using the carbon materials in memory elements.

A carbon-based resistivity-switching material may be characterized by its ratio of forms of carbon-carbon bonding. Carbon typically bonds to carbon to form either an sp$^2$-bond (a trigonal carbon-carbon double bond ("C═C")) or an sp$^3$-bond (a tetrahedral carbon-carbon single bond ("C—C")). In each case, a ratio of sp$^2$-bonds to sp$^3$-bonds can be determined via Raman spectroscopy by evaluating the D and G bands. In some embodiments, the range of materials may include those having a ratio such as $M_yN_z$ where M is the sp$^3$ material and N is the sp$^2$ material and y and z are any fractional value from zero to 1 as long as y+z=1. To provide sufficient resistivity-switching behavior useful in a memory device, the carbon-based material should have a relatively high concentration of $sp^2$ graphene crystallinity. DLC tends to be $sp^3$-hybridized, and to be amorphous with respect to long range order, and also has found to be switchable.

A carbon-based memory element may be formed by arranging a carbon-based resistivity-switching material between bottom and top electrodes to form a metal-insulator-metal ("MIM") structure. In such a configuration, the carbon-based resistivity-switching material sandwiched between the two metal or otherwise conducting layers serves as a carbon-based reversible resistance-switching element. A memory cell may then be formed by coupling the MIM structure in series with a steering element, such as a diode, tunnel junction, thin film transistor, or the like.

Integration of carbon-based resistivity-switching elements in memory cells, however, has proven challenging. In particular, physical vapor deposition ("PVD") processes are commonly used to form the electrodes of the MIM. However, if a PVD process is used to form a top electrode above a carbon-based memory element, the high energy levels associated with the physical sputtering process may damage the carbon-based material. Also, because some carbon-based materials are porous, materials formed above the carbon-based element, such as the material used to form the top electrode, may penetrate the carbon-based material and cause the MIM structure to short-circuit.

In addition, a MIM structure may be formed by depositing a layer of the bottom electrode material, depositing the carbon-based material layer on the bottom electrode material layer, depositing a layer of the top electrode material on the carbon-based material layer, and then patterning and etching the deposited layers to form pillars. Dielectric material, such as silicon dioxide, may then be deposited over and around the etched pillars to provide electrical isolation between adjacent pillars. Such dielectric "gapfill" material typically may be deposited by high density plasma chemical vapor deposition ("HDPCVD") techniques. Such deposition techniques are problematic, however, because HDPCVD techniques employ a high-density oxygen plasma component that etches carbon-based materials, causing undercutting and poor electrical performance.

Therefore, improved techniques for forming carbon-based memory cells are desired that may be used with conventional semiconductor processing techniques. Methods in accordance with this invention protect the carbon-based material layer from damage that may result from subsequent processing steps.

In a first exemplary method of this invention, a carbon-based element is formed above a substrate. After formation of the carbon-based element, a barrier layer is formed above the carbon-based element using a deposition technique that does not substantially damage the carbon-based element. For example, a barrier layer may be formed using an atomic layer deposition ("ALD"), a chemical vapor deposition ("CVD") technique, or other similar deposition technique selected to avoid damaging the carbon-based element. After formation of the barrier layer, a second deposition technique, such as PVD or other similar deposition technique, may be used to form additional layers, such as a top electrode, above the carbon-based element. During deposition of such additional layers, the barrier layer may protect the carbon-based element from damage, and may prevent infiltration into the carbon material by the material used to form the additional layers. In addition, a relatively thin carbon nitride layer optionally may be formed above the carbon-based element prior to forming the barrier layer.

In a second exemplary method in accordance with this invention, after formation of the etched pillars, a conformal dielectric liner is formed on sidewalls of the carbon-based element in the pillars prior to performing the dielectric gapfill. For example, a dielectric sidewall liner may be formed from boron nitride ("BN"), silicon nitride ("SiN") or other similar dielectric materials using ALD, PECVD, or other similar process.

Exemplary Inventive Memory Cell

FIG. 1 is a schematic illustration of an exemplary memory cell 10 in accordance with this invention. Memory cell 10 includes a carbon-based reversible resistance-switching element 12 coupled to a steering element 14. Carbon-based reversible resistance-switching reversible resistance switching element 12 includes a carbon-based reversible resistivity switching material (not separately shown) having a resistivity that may be reversibly switched between two or more states.

For example, carbon-based reversible resistance-switching material of element 12 may be in an initial, low-resistivity state upon fabrication. Upon application of a first voltage and/or current, the material is switchable to a high-resistivity state. Application of a second voltage and/or current may return reversible resistivity switching material to a low-resistivity state. Alternatively, carbon-based reversible resistance-switching element 12 may be in an initial, high-resistance state upon fabrication that is reversibly switchable to a low-resistance state upon application of the appropriate voltage(s) and/or current(s). When used in a memory cell, one resistance state may represent a binary "0," whereas another resistance state may represent a binary "1," although more than two data/resistance states may be used. Numerous reversible resistivity switching materials and operation of memory cells employing reversible resistance switching elements are described, for example, in U.S. patent application Ser. No. 11/125,939, filed May 9, 2005 and titled "Rewriteable Memory Cell Comprising A Diode And A Resistance Switching Material" (the "'939 application"), which is hereby incorporated by reference herein in its entirety for all purposes.

Steering element 14 may include a thin film transistor, a diode, metal-insulator-metal tunneling current device, or another similar steering element that exhibits non-ohmic conduction by selectively limiting the voltage across and/or the current flow through carbon-based reversible resistance-switching element 12. In this manner, memory cell 10 may be used as part of a two or three dimensional memory array and data may be written to and/or read from memory cell 10 without affecting the state of other memory cells in the array.

Exemplary embodiments of memory cell 10, carbon-based reversible resistance-switching element 12 and steering element 14 are described below with reference to FIGS. 2A-2D and FIG. 3.

Exemplary Embodiments of Memory Cells and Memory Arrays

Figure 2A:
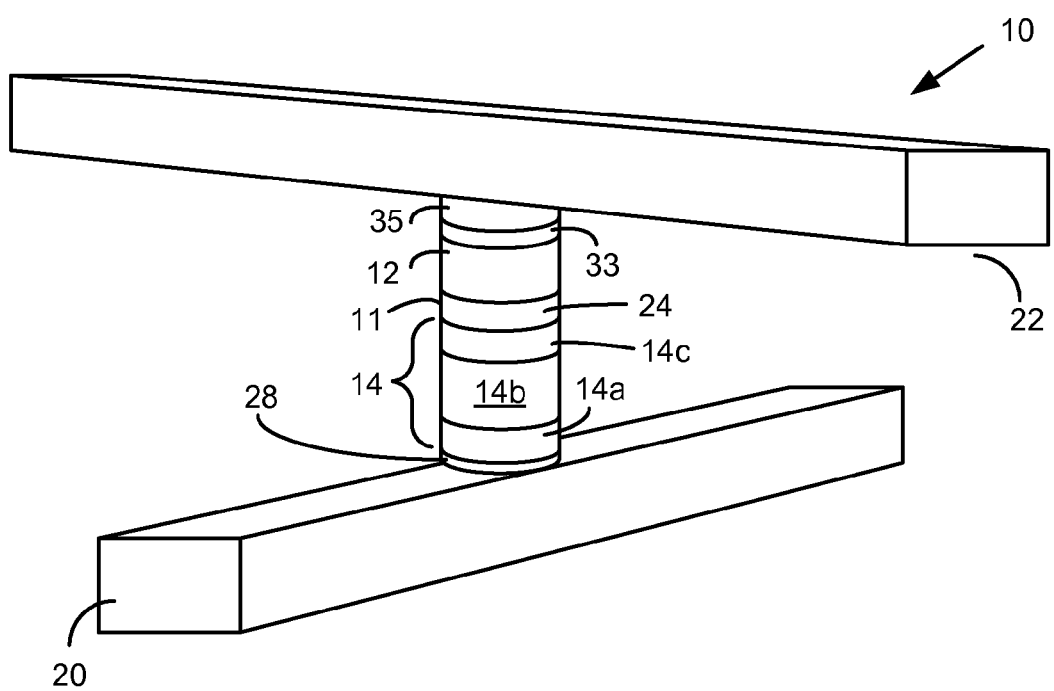
FIG. 2A is a simplified perspective view of an exemplary memory cell in accordance with this invention.

FIG. 2A is a simplified perspective view of an exemplary embodiment of a memory cell 10 in accordance with this invention. Memory cell 10 includes a pillar 11 coupled between a first conductor 20 and a second conductor 22. Pillar 11 includes a carbon-based reversible resistance-switching element 12 coupled in series with a steering element 14. In some embodiments, a barrier layer 24 may be formed between carbon-based reversible resistance-switching element 12 and steering element 14, a barrier layer 28 may be formed between steering element 14 and first conductor 20, and a barrier layer 33 may be formed between carbon-based reversible resistance-switching element 12 and a metal layer 35. Barrier layers 24, 28 and 33 may include titanium nitride, tantalum nitride, tungsten nitride, or other similar barrier layer. In some embodiments, barrier layer 33 and metal layer 35 may be formed as part of upper conductor 22.

Carbon-based reversible resistance-switching element 12 may include a carbon-based material suitable for use in a memory cell. In exemplary embodiments of this invention, carbon-based reversible resistance-switching element 12 may include graphitic carbon. For example, in some embodiments, graphitic carbon reversible resistivity switching materials may be formed as described in U.S. patent application Ser. No. 12/499,467, filed Jul. 8, 2009 and titled "Carbon-Based Resistivity-Switching Materials And Methods Of Forming The Same" (the "'467 application"), which is hereby incorporated by reference herein in its entirety for all purposes. In other embodiments, carbon-based reversible resistance-switching element 12 may include other carbon-based materials such as graphene, graphite, carbon nano-tube materials, DLC, silicon carbide, boron carbide, or other similar carbon-based materials. For simplicity, carbon-based reversible resistance-switching element 12 will be referred to in the remaining discussion interchangeably as "carbon element 12," or "carbon layer 12."

In an exemplary embodiment of this invention, steering element 14 includes a diode. In this discussion, steering element 14 is sometimes referred to as "diode 14." Diode 14 may include any suitable diode such as a vertical polycrystalline p-n or p-i-n diode, whether upward pointing with an n-region above a p-region of the diode or downward pointing with a p-region above an n-region of the diode. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed.

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first conductor 20 and/or second conductor 22 to improve device performance and/or aid in device fabrication.

Figure 2B:
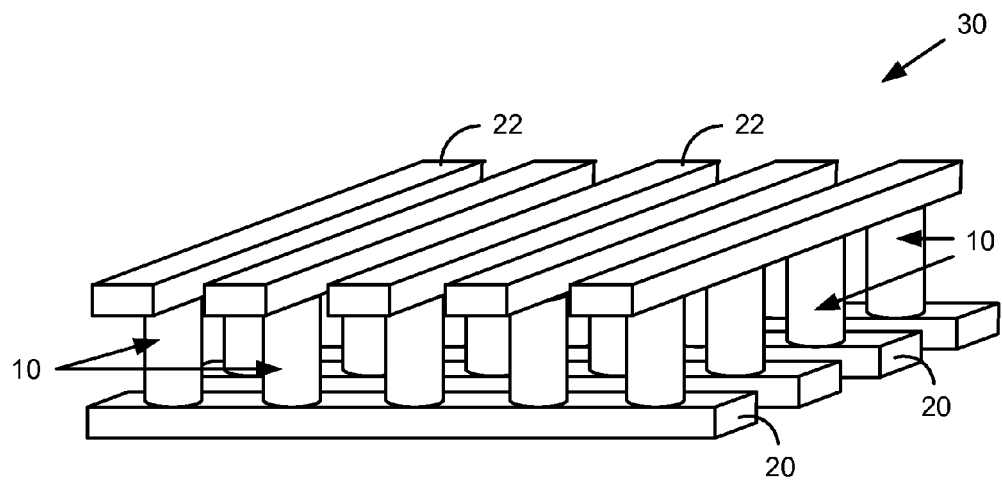
FIG. 2B is a simplified perspective view of a portion of a first exemplary memory level formed from a plurality of the memory cells of FIG. 2A.

FIG. 2B is a simplified perspective view of a portion of a first memory level 30 formed from a plurality of memory cells 10, such as memory cell 10 of FIG. 2A. For simplicity, carbon element 12, diode 14, barrier layers 24, 28 and 33, and metal layer 35 are not separately shown. Memory array 30 is a "cross-point" array including a plurality of bit lines (second conductors 22) and word lines (first conductors 20) to which multiple memory cells are coupled (as shown). Other memory array configurations may be used, as may multiple levels of memory.

Figure 2C:
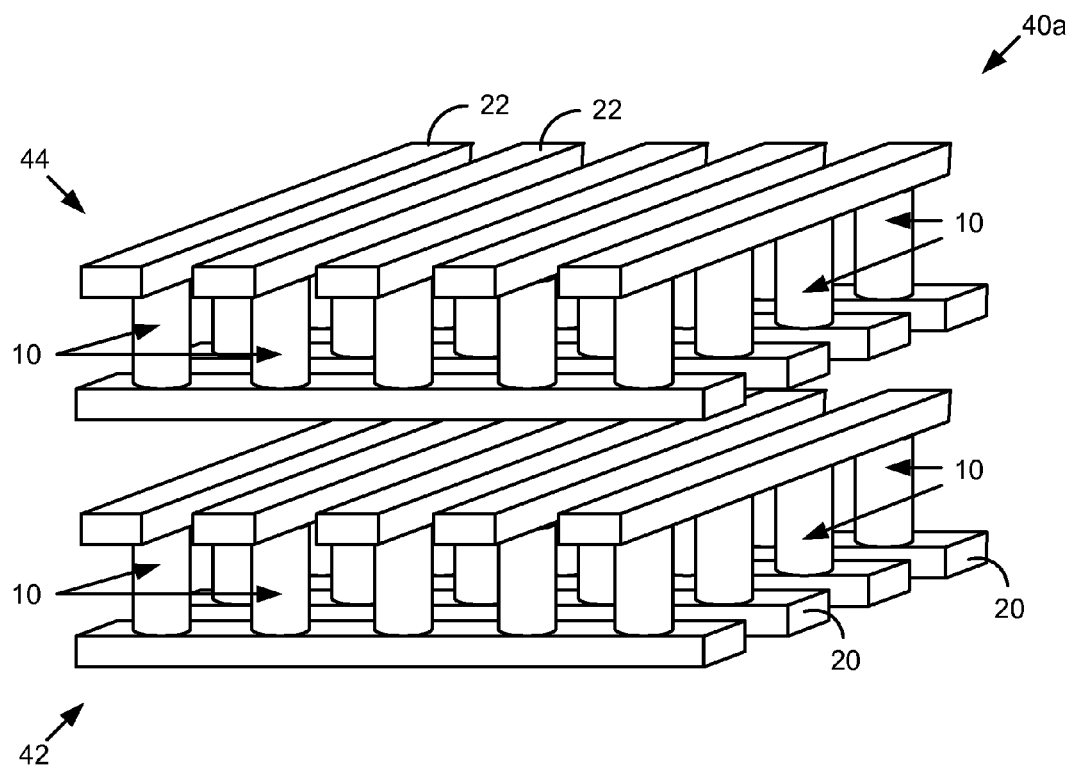
FIG. 2C is a simplified perspective view of a portion of a first exemplary three-dimensional memory array in accordance with this invention.

For example, FIG. 2C is a simplified perspective view of a portion of a monolithic three dimensional array 40a that includes a first memory level 42 positioned below a second memory level 44. Memory levels 42 and 44 each include a plurality of memory cells 10 in a cross-point array. Persons of ordinary skill in the art will understand that additional layers (e.g., an interlevel dielectric) may be present between the first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
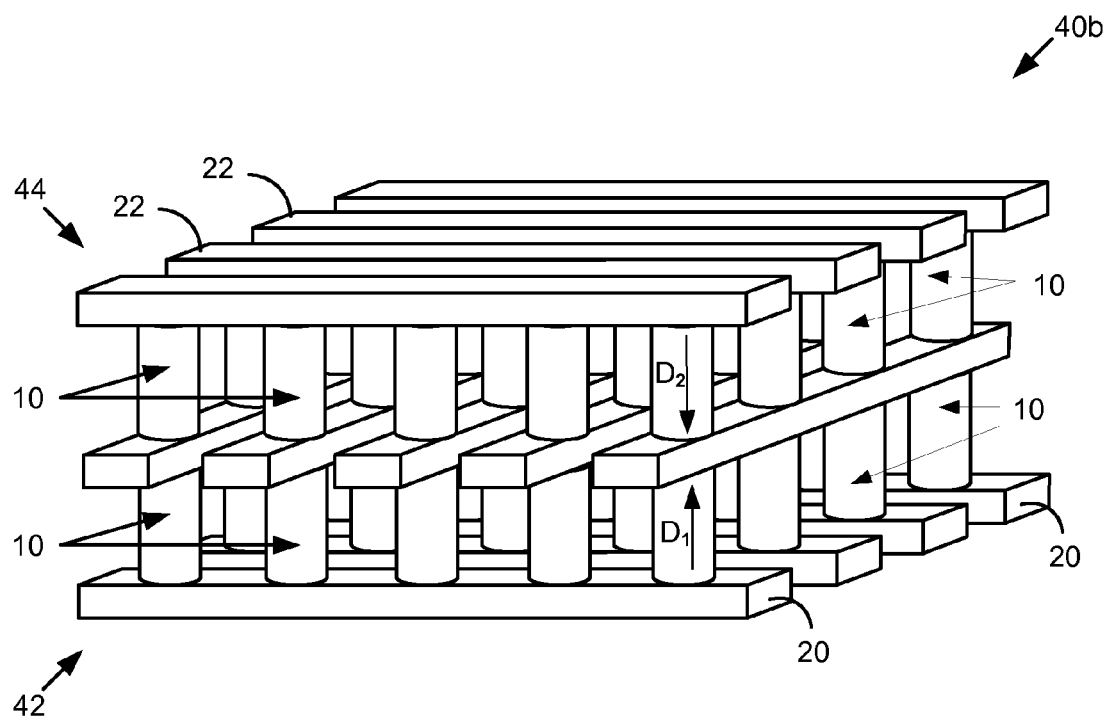
FIG. 2D is a simplified perspective view of a portion of a second exemplary three-dimensional memory array in accordance with this invention.

For example, in some embodiments, the memory levels may be formed as described in U.S. Pat. No. 6,952,030, titled "High-Density Three-Dimensional Memory Cell," which is hereby incorporated by reference herein in its entirety for all purposes. For instance, the upper conductors of a first memory level may be used as the lower conductors of a second memory level that is positioned above the first memory level as shown in FIG. 2D. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (the "'151 application"), which is hereby incorporated by reference herein in its entirety for all purposes. For example, as shown in FIG. 2D, the diodes of the first memory level 42 may be upward pointing diodes as indicated by arrow D1 (e.g., with p regions at the bottom of the diodes), whereas the diodes of the second memory level 44 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3:
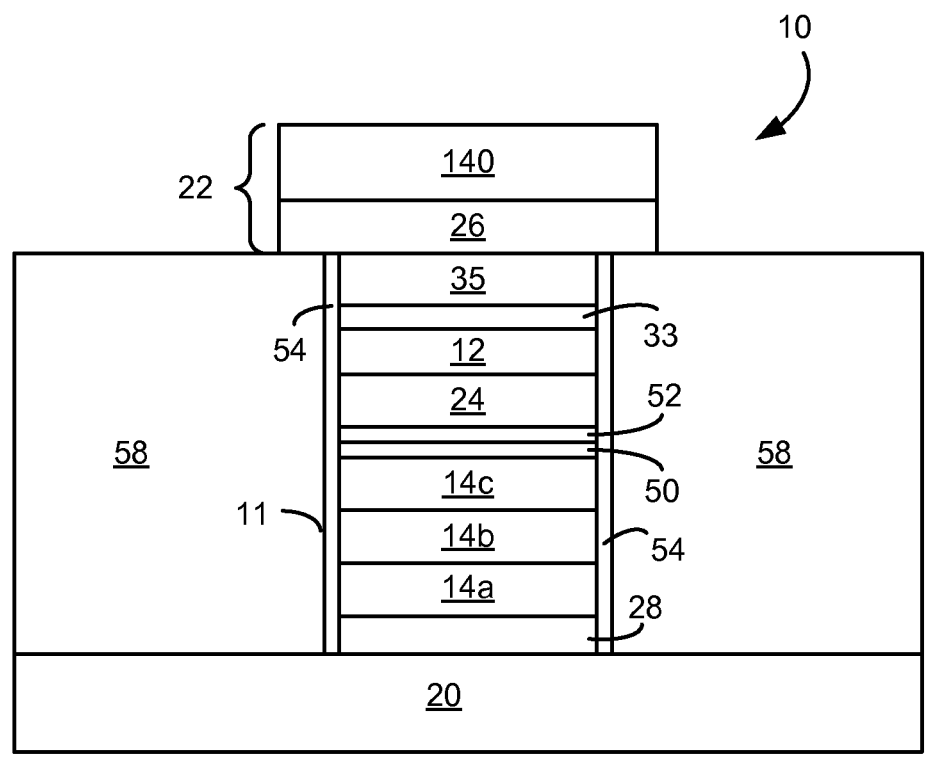
FIG. 3 is a cross-sectional view of an exemplary embodiment of a memory cell in accordance with this invention.

FIG. 3 is a cross-sectional view of an exemplary embodiment of memory cell 10 of FIG. 2A formed on a substrate, such as a wafer (not shown). In particular, memory cell 10 includes a pillar 11 coupled between first and second conductors 20 and 22, respectively. Pillar 11 includes carbon element 12 coupled in series with diode 14, and also may include barrier layers 24, 28, and 33, a silicide layer 50, a silicide-forming metal layer 52, and a metal layer 35. A dielectric layer 58 substantially surrounds pillar 11. In some embodiments, a sidewall liner 54 separates selected layers of pillar 11 from dielectric layer 58. Adhesion layers, antireflective coating layers and/or the like (not shown) may be used with first and/or second conductors 20 and 22, respectively, to improve device performance and/or facilitate device fabrication.

First conductor 20 may include any suitable conductive material such as tungsten, any appropriate metal, heavily doped semiconductor material, a conductive silicide, a conductive silicide-germanide, a conductive germanide, or the like. Second conductor 22 includes a barrier layer 26, which may include titanium nitride or other similar barrier layer material, and conductive layer 140, which may include any suitable conductive material such as tungsten, any appropriate metal, heavily doped semiconductor material, a conductive silicide, a conductive silicide-germanide, a conductive germanide, or the like.

Diode 14 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 14 may be formed from a polycrystalline semiconductor material such as polysilicon, a polycrystalline silicon-germanium alloy, polygermanium or any other suitable material. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed.

In some embodiments, a thin germanium and/or silicon-germanium alloy layer (not shown) may be formed on n+ polysilicon region 14a to prevent and/or reduce dopant migration from n+ polysilicon region 14a into intrinsic region 14b. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (the "'331 application"), which is hereby incorporated by reference herein in its entirety for all purposes. In some embodiments, a few hundred angstroms or less of silicon-germanium alloy with about 10 at % or more of germanium may be employed.

A barrier layer 28, such as titanium nitride, tantalum nitride, tungsten nitride, or other similar barrier layer material, may be formed between the first conductor 20 and the n+ region 14a (e.g., to prevent and/or reduce migration of metal atoms into the polysilicon regions).

If diode 14 is fabricated from deposited silicon (e.g., amorphous or polycrystalline), a silicide layer 50 may be formed on diode 14 to place the deposited silicon in a low resistivity state, as fabricated. Such a low resistivity state allows for easier programming of memory cell 10, as a large voltage is not required to switch the deposited silicon to a low resistivity state. For example, a silicide-forming metal layer 52 such as titanium or cobalt may be deposited on p+ polysilicon region 14c. In some embodiments, an additional nitride layer (not shown) may be formed at a top surface of silicide-forming metal layer 52. In particular, for highly reactive metals, such as titanium, an additional cap layer such as TiN layer may be formed on silicide-forming metal layer 52. Thus, in such embodiments, a Ti/TiN stack is formed on top of p+ polysilicon region 14c.

A rapid thermal anneal ("RTA") step may then be performed to form silicide regions by reaction of silicide-forming metal layer 52 with p+ region 14c. The RTA step may be performed at a temperature between about 650° C. to about 750° C., more generally between about 600° C. to about 800° C., preferably at about 750° C., for a duration between about 10 seconds to about 60 seconds, more generally between about 10 seconds to about 90 seconds, preferably about 1 minute, and causes silicide-forming metal layer 52 and the deposited silicon of diode 14 to interact to form silicide layer 50, consuming all or a portion of the silicide-forming metal layer 52.

As described in U.S. Pat. No. 7,176,064, titled "Memory Cell Comprising A Semiconductor Junction Diode Crystallized Adjacent To A Silicide," which is hereby incorporated by reference herein in its entirety for all purposes, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., silicide layer 50 enhances the crystalline structure of silicon diode 14 during annealing). Lower resistivity silicon thereby is provided. Similar results may be achieved for silicon-germanium alloy and/or germanium diodes.

In embodiments in which a nitride layer was formed at a top surface of silicide-forming metal layer 52, following the RTA step, the nitride layer may be stripped using a wet chemistry. For example, if silicide-forming metal layer 52 includes a TiN top layer, a wet chemistry (e.g., ammonium, peroxide, water in a 1:1:1 ratio) may be used to strip any residual TiN.

As discussed above, carbon layer 12 may be susceptible to damage caused during subsequent processing step. In exemplary methods in accordance with this invention, described in more detail with respect to FIG. 4, processing methods are used to protect carbon layer 12 from damage during subsequent processing steps.

In a first exemplary method of this invention, barrier layer 33 may be formed above carbon layer 12. Barrier layer 33 may be between about 50-200 angstroms, more generally between about 20-300 angstroms, of titanium nitride, tungsten nitride, tantalum nitride, or other similar barrier layer material. Barrier layer 33 may prevent materials used to form second conductor 22 from infiltrating the carbon-based material of carbon layer 12.

Barrier layer 33 is formed using a deposition technique that does not substantially damage carbon layer 12. In an exemplary embodiment, an ALD technique may be used to deposit barrier layer 33. In particular, barrier layer 33 may be formed by ALD using a first reactant species that includes a metal halide precursor, such as titanium tetrachloride ("TiCL$_4$") (for forming a TiN barrier layer), tungsten hexafluoride ("HF$_6$") (for forming a tungsten nitride barrier layer), or other similar compound, and a second reactant species that includes a nitrogen ("N") source such as ammonia ("NH$_3$"), hydrazine ("N$_2$H$_4$"), or a mixture of N$_2$ and H$_2$, or other similar nitrogen source.

In another alternative exemplary embodiment, a relatively thin layer 31 of a compound that promotes chemisorption, such as carbon nitride (CN$_x$), may be deposited above carbon layer 12 prior to forming barrier layer 33. For example, carbon nitride barrier layer 31 may be deposited using a plasma enhanced chemical vapor deposition ("PECVD"), ALD or other similar technique. Carbon nitride layer 31 may have a material thickness of between about 50-300 angstroms, more generally between about 20-800 angstroms. Carbon nitride layer 31 may promote adhesion between carbon layer 12 and barrier layer 33, may substantially promote chemisorption, and may render the carbon material of carbon layer 12 reactive to the deposition of barrier layer 33. In particular, the first ALD precursor molecules may be chemically adsorbed on the surface of carbon nitride layer 31 much more strongly and easily than the surface of carbon layer 12. Additionally, carbon nitride layer 31 typically is a denser material than carbon layer 12, and thus may prevent interaction of the precursor molecules, and may minimize penetration of the precursor molecules, into carbon layer 12.

In other exemplary embodiments of this invention, barrier layer 33 may be formed using a CVD technique, or other similar deposition technique selected to avoid damaging the carbon-based material of carbon layer 12.

In another exemplary method of this invention, a conformal dielectric liner 54 is formed around the sidewalls of pillar 11. In an exemplary method of this invention, and as described in more detail below, dielectric sidewall liner 54 may include boron nitride, silicon nitride, or another similar dielectric liner material. Dielectric sidewall liner 54 may be formed by ALD, PECVD, or other similar method. In at least one embodiment of this invention, dielectric sidewall liner 54 is formed from BN by ALD. Dielectric sidewall liner 54 may protect sidewalls of carbon layer 12 during a subsequent deposition of an oxygen-rich dielectric 58.

Exemplary Fabrication Processes for Memory Cells

Referring now to FIGS. 4A-4G, a first exemplary method of forming an exemplary memory level in accordance with this invention is described. In particular, FIGS. 4A-4G illustrate an exemplary method of forming an exemplary memory level including memory cells 10 of FIG. 3. As will be described below, the first memory level includes a plurality of memory cells that each include a steering element and a carbon-based reversible resistance switching element coupled to the steering element. Additional memory levels may be fabricated above the first memory level (as described previously with reference to FIGS. 2C-2D).

With reference to FIG. 4A, substrate 100 is shown as having already undergone several processing steps. Substrate 100 may be any suitable substrate such as a silicon, germanium, silicon-germanium, undoped, doped, bulk, silicon-on-insulator ("SOI") or other substrate with or without additional circuitry. For example, substrate 100 may include one or more n-well or p-well regions (not shown).

Isolation layer 102 is formed above substrate 100. In some embodiments, isolation layer 102 may be a layer of silicon dioxide, silicon nitride, silicon oxynitride or any other suitable insulating layer.

Following formation of isolation layer 102, an adhesion layer 104 is formed over isolation layer 102 (e.g., by physical vapor deposition or another method). For example, adhesion layer 104 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, adhesion layer 104 may be optional.

After formation of adhesion layer 104, a conductive layer 106 is deposited over adhesion layer 104. Conductive layer 106 may include any suitable conductive material such as tungsten or another appropriate metal, heavily doped semiconductor material, a conductive silicide, a conductive silicide-germanide, a conductive germanide, or the like deposited by any suitable method (e.g., CVD, physical vapor deposition ("PVD"), etc.). In at least one embodiment, conductive layer 106 may comprise about 200 to about 2500 angstroms of tungsten. Other conductive layer materials and/or thicknesses may be used.

Following formation of conductive layer 106, adhesion layer 104 and conductive layer 106 are patterned and etched. For example, adhesion layer 104 and conductive layer 106 may be patterned and etched using conventional lithography techniques, with a soft or hard mask, and wet or dry etch processing. In at least one embodiment, adhesion layer 104 and conductive layer 106 are patterned and etched to form substantially parallel, substantially co-planar first conductors 20. Exemplary widths for first conductors 20 and/or spacings between first conductors 20 range from about 200 to about 2500 angstroms, although other conductor widths and/or spacings may be used.

After first conductors 20 have been formed, a dielectric layer 58a is formed over substrate 100 to fill the voids between first conductors 20. For example, approximately 3000-7000 angstroms of silicon dioxide may be deposited on the substrate 100 and planarized using chemical mechanical polishing or an etchback process to form a planar surface 110. Planar surface 110 includes exposed top surfaces of first conductors 20 separated by dielectric material (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

In other embodiments of the invention, first conductors 20 may be formed using a damascene process in which dielectric layer 58a is formed, patterned and etched to create openings or voids for first conductors 20. The openings or voids then may be filled with adhesion layer 104 and conductive layer 106 (and/or a conductive seed, conductive fill and/or barrier layer if needed). Adhesion layer 104 and conductive layer 106 then may be planarized to form planar surface 110. In such an embodiment, adhesion layer 104 will line the bottom and sidewalls of each opening or void.

Figure 4B:
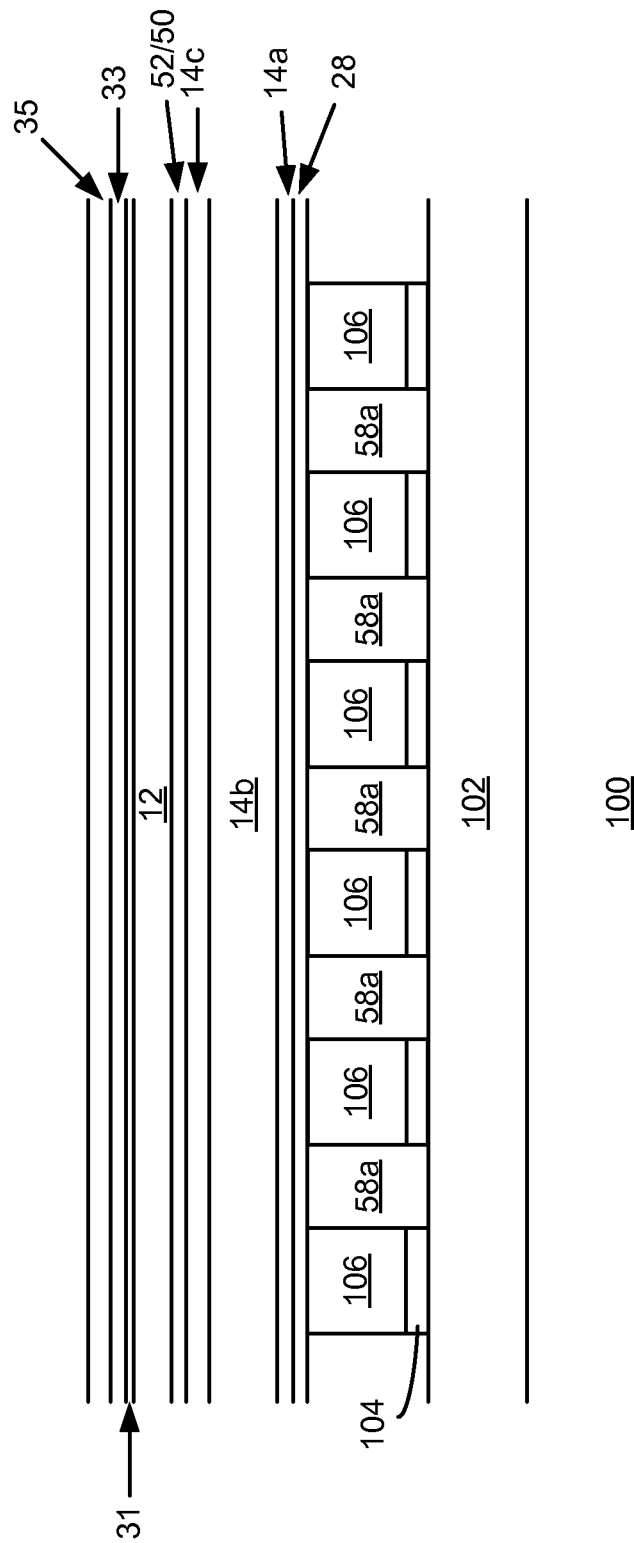

Following planarization, the diode structures of each memory cell are formed. With reference to FIG. 4B, a barrier layer 28 is formed over planarized top surface 110 of substrate 100. Barrier layer 28 may be about 20 to about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 28, deposition of the semiconductor material used to form the diode of each memory cell begins (e.g., diode 14 in FIGS. 1 and 3). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 4B, following formation of barrier layer 28, a heavily doped n+ silicon layer 14a is deposited on barrier layer 28. In some embodiments, n+ silicon layer 14a is in an amorphous state as deposited. In other embodiments, n+ silicon layer 14a is in a polycrystalline state as deposited. CVD or another suitable process may be employed to deposit n+ silicon layer 14a. In at least one embodiment, n+ silicon layer 14a may be formed, for example, from about 100 to about 1000 angstroms, preferably about 100 angstroms, of phosphorus or arsenic doped silicon having a doping concentration of about $10^{21}$ cm$^{-3}$. Other layer thicknesses, doping types and/or doping concentrations may be used. N+ silicon layer 14a may be doped in situ, for example, by flowing a donor gas during deposition. Other doping methods may be used (e.g., implantation).

After deposition of n+ silicon layer 14a, a lightly doped, intrinsic and/or unintentionally doped silicon layer 14b may be formed over n+ silicon layer 14a. In some embodiments, intrinsic silicon layer 14b may be in an amorphous state as deposited. In other embodiments, intrinsic silicon layer 14b may be in a polycrystalline state as deposited. CVD or another suitable deposition method may be employed to deposit intrinsic silicon layer 14b. In at least one embodiment, intrinsic silicon layer 14b may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 14a prior to depositing intrinsic silicon layer 14b to prevent and/or reduce dopant migration from n+ silicon layer 14a into intrinsic silicon layer 14b (as described in the '331 application, previously incorporated).

Heavily doped, p-type silicon may be either deposited and doped by ion implantation or may be doped in situ during deposition to form a p+ silicon layer 14c. For example, a blanket p+ implant may be employed to implant boron a predetermined depth within intrinsic silicon layer 14b. Exemplary implantable molecular ions include $BF_2$, $BF_3$, B and the like. In some embodiments, an implant dose of about $1-5\times 10^{15}$ ions/cm$^2$ may be employed. Other implant species and/or doses may be used. Further, in some embodiments, a diffusion process may be employed. In at least one embodiment, the resultant p+ silicon layer 14c has a thickness of about 100-700 angstroms, although other p+ silicon layer sizes may be used.

Following formation of p+ silicon layer 14c, a silicide-forming metal layer 52 is deposited over p+ silicon layer 14c. Exemplary silicide-forming metals include sputter or otherwise deposited Ti or cobalt. In some embodiments, silicide-forming metal layer 52 has a thickness of about 10 to about 200 angstroms, preferably about 20 to about 50 angstroms and more preferably about 20 angstroms. Other silicide-forming metal layer materials and/or thicknesses may be used. A nitride layer (not shown) may be formed at the top of silicide-forming metal layer 52.

Following formation of silicide-forming metal layer 52, an RTA step may be performed to form silicide layer 50, consuming all or a portion of the silicide-forming metal layer 52. The RTA step may be performed at a temperature between about 650° C. and about 750° C., more generally between about 600° C. and about 800° C., preferably at about 750° C., for a duration between about 10 seconds to about 60 seconds, more generally between about 10 seconds to about 90 seconds, preferably about 60 seconds. Following the RTA step, any residual nitride layer from silicide-forming metal layer 52 may be stripped using a wet chemistry, as described above, and as is known in the art.

Following the RTA step and the nitride strip step, a barrier layer 24 is deposited. Barrier layer 24 may be about 20 to about 500 angstroms, and preferably about 200 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed. Any suitable method may be used to form barrier layer 24. For example, PVD, ALD, or the like may be used.

Next, carbon layer 12 is deposited over barrier layer 24. Carbon layer 12 may be formed by a PECVD method, for example. Other methods may be used, including, without limitation, sputter deposition from a target, PVD, CVD, arc discharge techniques, and laser ablation. Other methods may be used to form carbon layer 12, such as a damascene integration method, for example. Carbon layer 12 may include graphitic carbon. In alternative embodiments, other carbon-based materials may be used, such as graphene, graphite, carbon nano-tube materials, DLC or other similar carbon-based materials. Carbon layer 12 is formed having a thickness between about 100 and about 600 angstroms, more generally between about 1 and about 1000 angstroms. Other thicknesses may be used.

In accordance with this invention, a barrier layer 33 is formed above carbon element 12 by ALD, CVD, or other similar processing technique. In addition, a carbon nitride layer 31 optionally may be deposited above carbon element 12 prior to forming barrier layer 33. Exemplary processes for forming carbon nitride layer 31 and barrier layer 33 are described in turn.

A carbon nitride barrier layer 31 having a thickness between about 50 angstroms to about 300 angstroms, more generally between about 20 angstroms to about 600 angstroms, of carbon nitride may be formed above carbon layer 12. For example, carbon nitride barrier layer 31 may be deposited using PECVD, ALD or other similar deposition techniques.

Table 1 below describes an exemplary process window for forming a carbon nitride layer within a PECVD chamber using a processing gas comprising one or more hydrocarbon compounds and a carrier/dilutant gas. Persons of ordinary skill in the art will understand that the carrier gas may comprise any suitable inert or non-reactive gas such as one or more of He, Ar, $H_2$, Kr, Xe, $N_2$, etc. In some embodiments, the hydrocarbon compounds may have the formula $C_xH_y$, with x ranging from about 2 to 4, and y ranging from about 2 to 10.

TABLE 1

EXEMPLARY PECVD PROCESS PARAMETERS

| PROCESS PARAMETER | EXEMPLARY RANGE | PREFERRED RANGE |
|---|---|---|
| $C_xH_y$ Flow Rate (sccm) | 100-5000 | 500-1500 |
| $N_2$ Flow Rate (sccm) | 5000-20,000 | 5000-10,000 |
| Chamber Pressure (Torr) | 0.2-10 | 3-7 |
| 1$^{st}$ RF Frequency (MHz) | 10-50 | 12-15 |
| 2$^{nd}$ RF Frequency (KHz) | 90-400 | 90-110 |
| 1$^{st}$ RF Power Density (W/cm$^2$) | 0.8-5.0 | 1.5-2.5 |
| 2$^{nd}$ RF Power Density (W/cm$^2$) | 0-2 | 0-1.4 |
| Process Temperature (° C.) | 200-650 | 350-650 |
| Heater-to-Showerhead Spacing (mils) | 250-1000 | 400-550 |

Persons of ordinary skill in the art will understand that other process parameters may be used. In addition, persons of ordinary skill in the art will understand that other processes may be used to form carbon nitride barrier layer 31. For example, carbon nitride barrier layer 31 may be formed by nitriding a top layer of carbon layer 12. Such a nitriding process may be performed, for example, by exposing carbon layer 12 to a remote plasma with a nitrogen species.

Barrier layer 33 is formed above carbon nitride layer 31 (or carbon layer 12 if optional carbon nitride layer 31 is omitted). Barrier layer 33 may be titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials may be employed.

In an exemplary embodiment of this invention, barrier layer 33 is formed by ALD. In an ALD process, a substrate is exposed to a first reactant and one monolayer of the first reactant is chemisorbed onto the surface. The excess of the first reactant is then purged out of the chamber with an inert gas pulse before exposing the substrate to the second reactant. The second reactant then chemisorbs and undergoes an exchange reaction with the first reactant on the substrate surface. This results in the formation of a solid molecular film and a gaseous side product that may then be removed with an inert gas pulse.

There are primarily two types of ALD processes: (1) "Thermal ALD," in which the second reactant is exposed to the substrate after the purge of the first reactant, and the second reactant is thermally reacted with the monolayer of the first reactant; and (2) "Plasma ALD," in which a remote microwave plasma or in-situ RF plasma are used to react the second reactant with a monolayer of the first reactant during the flow cycle of the second reactant. Table 2 below lists exemplary process conditions for depositing titanium nitride for both types of ALD processes.

TABLE 2

EXEMPLARY ALD TiN PROCESS PARAMETERS

| PROCESS PARAMETER | Thermal ALD | | Plasma ALD | |
| --- | --- | --- | --- | --- |
| | EXEMPLARY RANGE | PREFERRED RANGE | EXEMPLARY RANGE | PREFERRED RANGE |
| Cycle 1 Temp (° C.) | 300-600 | 350-450 | 100-350 | 150-300 |
| Cycle 1 Pressure (T) | 0.1-10 | 1-5 | 0.1-10 | 1-5 |
| Cycle 1 Dose (sccm) | 10-500 | 20-100 | 10-500 | 20-100 |
| Cycle 2 Temp (° C.) | 300-600 | 350-450 | 100-350 | 150-300 |
| Cycle 2 Pressure (T) | 0.1-10 | 1-5 | 0.1-10 | 1-5 |
| Cycle 2 Dose (sccm) | 20-1000 | 300-800 | 20-1000 | 300-800 |
| RF Frequency (MHz) | — | — | 10-50 | 12-15 |
| RF Power (W) | — | — | 50-500 | 50-250 |
| Plasma Pulse Time (seconds) | — | — | 5-100 | 10-40 |
| Deposition Rate (nm/cycle) | 0.1-0.3 | 0.20-0.25 | 0.06-0.30 | 0.06-0.10 |

For Plasma ALD, a remote downstream plasma also can be used to generate the plasma rather than an RF source. For Thermal ALD, exemplary cycle 1 precursors include $TiCL_4$, $Ti(OC_xH_y)_4$ (x=1-4, y=2x+1), $Ti(OC_xH_y)_a(Cl)_b$ (x=1,4, y=2x+1, a+b=4), and dimethylamide titanium ("TDMAT"), with $TiCL_4$ being a preferred precursor, and exemplary cycle 2 precursors include $NH_3$, $N_2H_4$, $N_2+H_2$, with $NH_3$ being a preferred precursor. For Plasma ALD, exemplary cycle 1 precursors include $TiCL_4$, $Ti(OC_xH_y)_4$ (x=1-4, y=2x+1), $Ti(OC_xH_y)_a(Cl)_b$ (x=1,4, y=2x+1, a+b=4), and TDMAT, with TDMAT being a preferred precursor, and exemplary cycle 2 precursors include $NH_3$, $N_2H_4$, $N_2+H_2$, with $NH_3$ being a preferred precursor. Other process parameters and precursors may be used.

TiN may be deposited in cycles, in which ALD of Ti is followed by ALD of N. In a first cycle, the Ti deposition cycle, a titanium precursor is allowed to deposit onto the surface. A first purge step is performed to remove any of the first precursor which remains and which has not been deposited on the substrate. In a second cycle, the N deposition cycle, a nitrogen precursor is allowed to absorb and/or react with the adsorbed Ti, to produce about a monolayer of titanium nitride. A second purge step is performed to remove any of the second precursor which remains and which has not reacted with the Ti.

The cycles are repeated to form a desired thickness of TiN. In exemplary embodiments of this invention, the ALD process is performed to form a barrier layer 33 having a thickness of between about 20 to about 500 angstroms, and more preferably between about 50 to about 200 angstroms. Other thicknesses may be used.

In other embodiments, barrier layer 33 may include tungsten nitride, tantalum nitride, or other similar barrier layer materials. For example, in one such alternative embodiment in which barrier layer 33 is formed from tungsten nitride, an ALD process similar to that described above may be used in which the first precursor is tungsten hexafluoride ($WF_6$), and the second precursor is a nitrogen source such as $NH_3$, $N_2H_4$, or a mixture of $N_2$, or other similar reactant species.

In other embodiments, barrier layer 33 may be formed using a CVD technique, or other similar deposition technique selected to avoid damaging the carbon-based material of carbon element 12.

Next, a metal layer 35 may be deposited over barrier layer 33. For example, between about 800 to about 1200 angstroms, more generally between about 500 angstroms to about 1500 angstroms, of tungsten may be deposited on barrier layer 33. Other materials and thicknesses may be used. Any suitable method may be used to form metal layer 35. For example, CVD, PVD, or the like may be employed. As described in more detail below, metal layer 35 may be used as a hard mask layer, and also may be used as a stop during a subsequent chemical mechanical planarization ("CMP") step. A hard mask is an etched layer which serves to pattern the etch of an underlying layer.

Figure 4C:
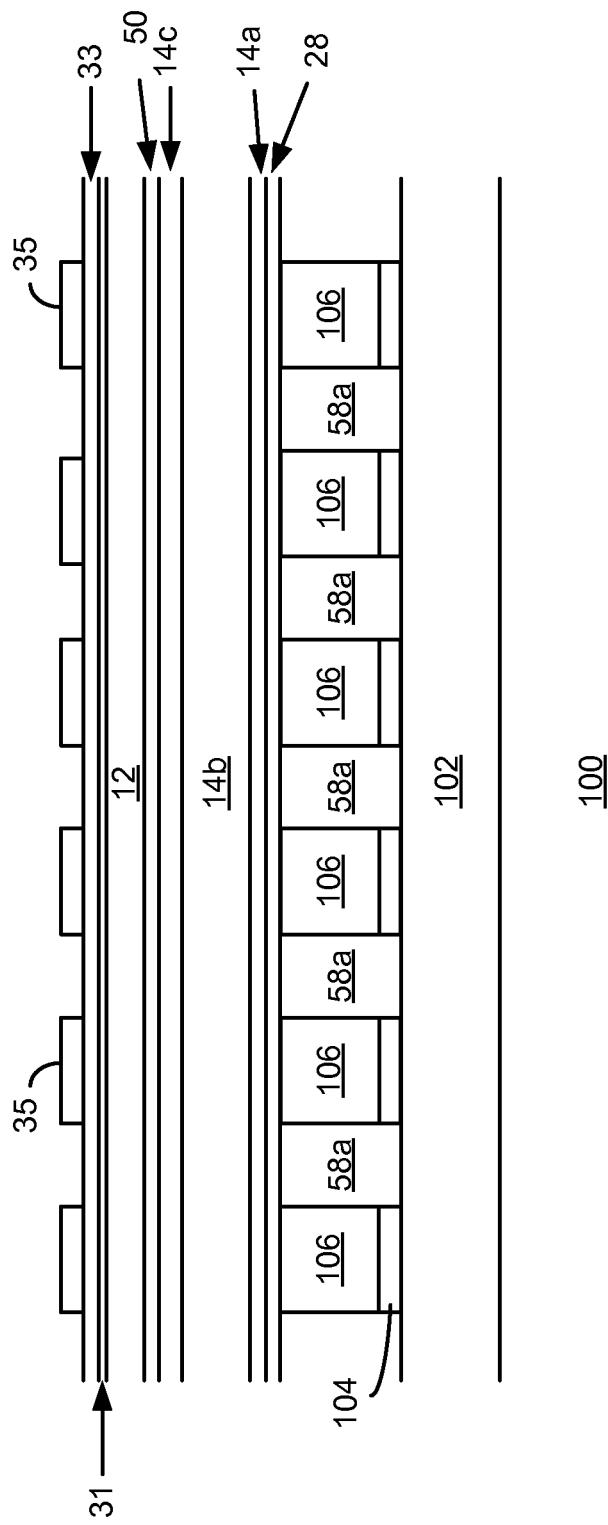

As shown in FIG. 4C, metal layer 35 is patterned and etched to form patterned metal hardmask regions 35. Patterned metal hardmask regions 35 may have about the same pitch and about the same width as conductors 20 below, such that each patterned metal hardmask regions 35 is formed on top of a conductor 20. Some misalignment may be tolerated. Persons of ordinary skill in the art will understand that patterned metal hardmask regions 35 may have a smaller width than conductors 20.

For example, photoresist ("PR") may be deposited on metal layer 35, patterned using standard photolithography techniques, and then the photoresist may be removed. Alternatively, a hard mask of some other material, for example silicon dioxide, may be formed on top of metal layer 33, with bottom antireflective coating ("BARC") on top, then patterned and etched. Similarly, dielectric antireflective coating ("DARC") may be used as a hard mask.

Figure 4D:
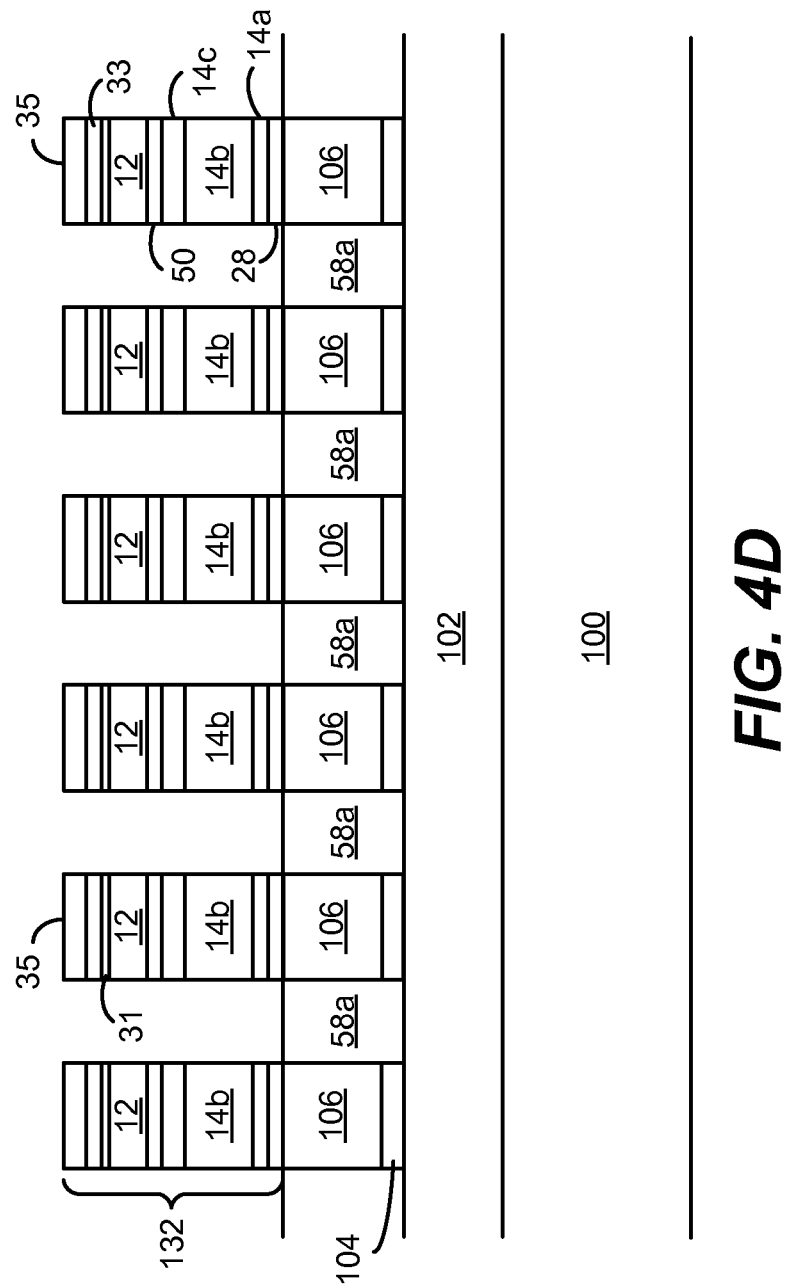

As shown in FIG. 4D, metal hardmask regions 35 are used to pattern and etch barrier layer 33, carbon nitride barrier layer 31, carbon layer 12, silicide-forming metal layer 52, diode layers 14a-14c and barrier layer 28 to form pillars 132. Pillars 132 may have about the same pitch and about the same width as conductors 20 below, such that each pillar 132 is formed on top of a conductor 20. Some misalignment may be tolerated. Persons of ordinary skill in the art will understand that pillars 132 may have a smaller width than conductors 20.

Any suitable etch chemistries, and any suitable etch parameters, flow rates, chamber pressures, power levels, process temperatures, and/or etch rates may be used. In some embodiments, barrier layer 33, carbon nitride barrier layer 31, carbon element 12, barrier layer 24, silicide-forming metal layer 52, diode layers 14a-14c and barrier layer 28 may be patterned using a single etch step. In other embodiments, separate etch steps may be used. The etch proceeds down to dielectric layer 58a.

In some exemplary embodiments, the memory cell layers may be etched using chemistries selected to minimize or avoid damage to carbon material. For example, $O_2$, CO, $N_2$, or $H_2$, or other similar chemistries may be used. In embodiments in which CNT material is used in the memory cells, oxygen ("$O_2$"), boron trichloride ("$BCl_3$") and/or chlorine ("$Cl_2$") chemistries, or other similar chemistries, may be used. Any suitable etch parameters, flow rates, chamber pressures, power levels, process temperatures, and/or etch rates may be used. Exemplary methods for etching carbon material are described, for example, in U.S. patent application Ser. No. 12/415,964, "Electronic Devices Including Carbon-Based Films Having Sidewall Liners, and Methods of Forming Such Devices," filed Mar. 31, 2009, which is hereby incorporated by reference in its entirety for all purposes.

After the memory cell layers have been etched, pillars 132 may be cleaned. In some embodiments, a dilute hydrofluoric/sulfuric acid clean is performed. Post-etch cleaning may be performed in any suitable cleaning tool, such as a Raider tool, available from Semitool of Kalispell, Mont. Exemplary post-etch cleaning may include using ultra-dilute sulfuric acid (e.g., about 1.5-1.8 wt %) for about 60 seconds and ultra-dilute hydrofluoric ("HF") acid (e.g., about 0.4-0.6 wt %) for about 60 seconds. Megasonics may or may not be used. Alternatively, $H_2SO_4$ may be used.

In accordance with this invention, and as illustrated in FIG. 4D, a conformal dielectric liner 54 is deposited above and around pillars 132. Dielectric liner 54 may be formed with an oxygen-poor deposition chemistry (e.g., without a high oxygen plasma component) to protect sidewalls of carbon layer 12 during a subsequent deposition of an oxygen-rich gap-fill dielectric 58b (e.g., $SiO_2$) (not shown in FIG. 4D).

In an exemplary embodiment of this invention, dielectric liner 54 may be formed from BN. Alternatively, dielectric sidewall liner 54 may be formed from other materials, such as SiN, $Si_xC_yN_z$ and $Si_xO_yN_z$ (with low O content), where x, y and z are non-zero numbers resulting in stable compounds. BN dielectric liners may provide the following benefits: (1) low leakage current density; (2) high breakdown voltage; (3) and low dielectric constant to reduce coupling between the neighbor cells. Persons of ordinary skill in the art will understand that other dielectric materials may be used to form dielectric liner 54.

In exemplary embodiments, dielectric liner 54 has a stoichiometry of N:B (or Si) between about 1:1 to about 1.2:1, preferably about 1:1, so that dielectric liner 54 has relatively low leakage current density (e.g., less than about $10^{-8}$ A/cm$^2$) and relatively high breakdown voltage (e.g., greater than about 5 MV/cm, preferably greater than about 8 MV/cm). In some exemplary embodiments, dielectric liner 54 has a dielectric constant between about 3.5 and about 5.5.

Dielectric liner 54 may be formed by ALD, PECVD, or other similar process. Table 3 includes exemplary parameters for deposition of a BN dielectric liner 54 using ALD.

TABLE 3

| | ALD BN LINER PROCESS PARAMETERS | | | |
|---|---|---|---|---|
| | Thermal ALD | | Plasma ALD | |
| PROCESS PARAMETER | EXEMPLARY RANGE | PREFERRED RANGE | EXEMPLARY RANGE | PREFERRED RANGE |
| Cycle 1 Temp (° C.) | 400-600 | 400-500 | 200-600 | 400-500 |
| Cycle 1 Pressure (T) | 0.1-10 | 1-3 | 0.1-10 | 1-3 |
| Cycle 1 Dose (sccm) | 20-500 | 50-300 | 20-500 | 50-300 |
| Cycle 2 Temp (° C.) | 300-600 | 350-450 | 200-600 | 350-450 |
| Cycle 2 Pressure (T) | 0.1-10 | 1-3 | 0.1-10 | 1-3 |
| Cycle 2 Dose (sccm) | 100-2000 | 100-800 | 100-2000 | 100-800 |
| RF Frequency (MHz) | — | — | 10-50 | 12-15 |
| RF Power (W) | — | — | 50-500 | 50-250 |
| Plasma Pulse Time (seconds) | — | — | 5-100 | 10-40 |

Exemplary cycle 1 precursors include $BCl_3$, $BBr_3$ $B_2H_6$, $BF_3$, with $BCl_3$ being a preferred precursor, and exemplary cycle 2 precursors include $NH_3$, $N_2H_4$, $N_2+H_2$, with $NH_3$ being a preferred precursor. For Plasma ALD, a remote downstream plasma also can be used to generate the plasma rather than an RF source.

BN may be deposited in cycles, in which ALD of boron ("B") is followed by ALD of N. In a first cycle, the B deposition cycle, a boron precursor is allowed to deposit onto the surface. A first purge step is performed to remove any of the first precursor which remains and which has not been deposited on the substrate. In a second cycle, the N deposition cycle, a nitrogen precursor is allowed to absorb and/or react with the adsorbed B, to produce about a monolayer of boron nitride. A second purge step is performed to remove any of the second precursor which remains and which has not reacted with the B.

The number of pairs of cycles determines the overall film thickness. In exemplary embodiments of this invention, the ALD process is performed to form a dielectric liner 54 having a thickness of between about 100 angstroms to about 250 angstroms, more generally between about 100 angstroms to about 300 angstroms. Other thicknesses may be used.

Figure 4E:
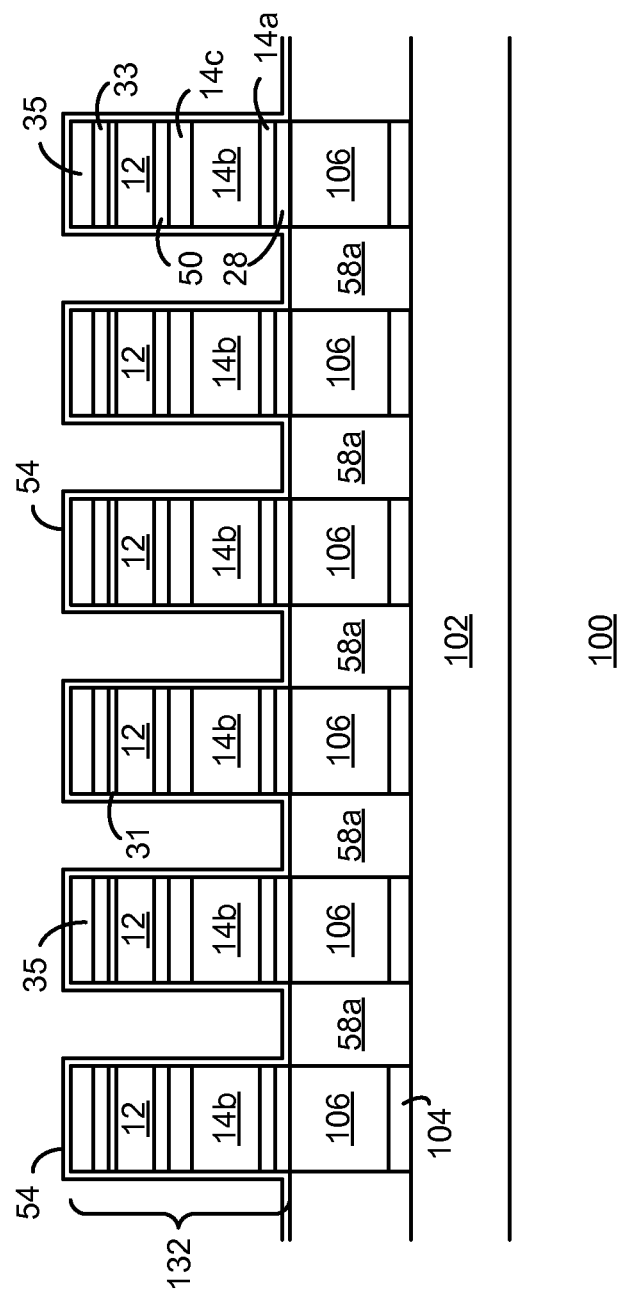
Figure 4F:
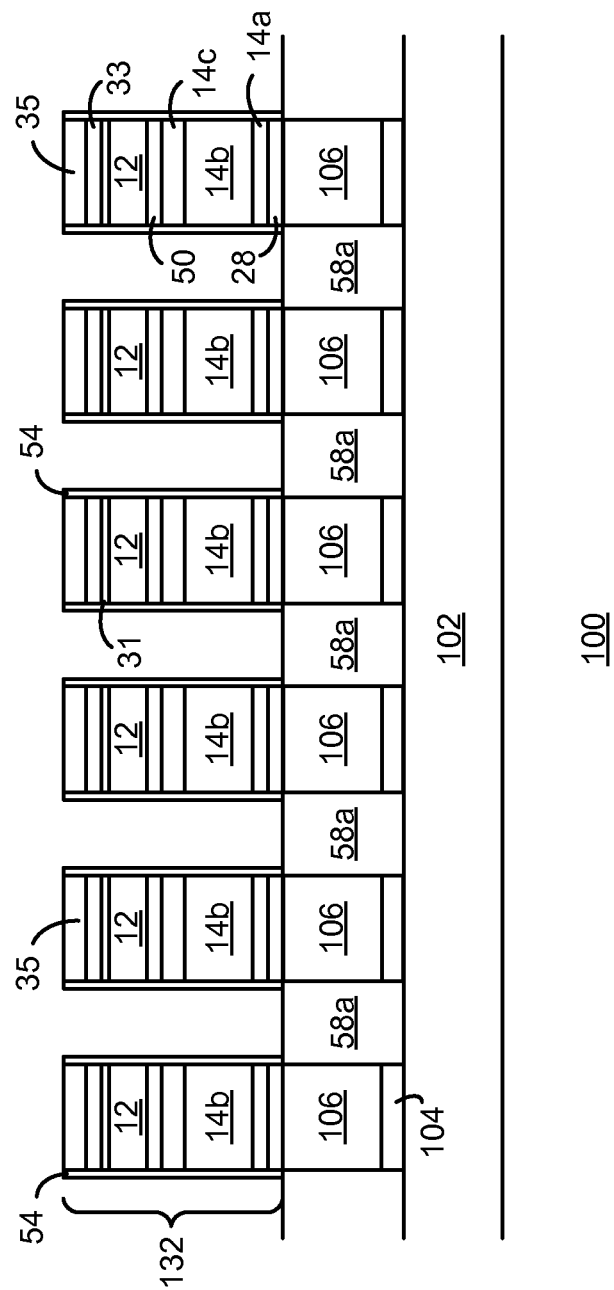
Figure 4H:
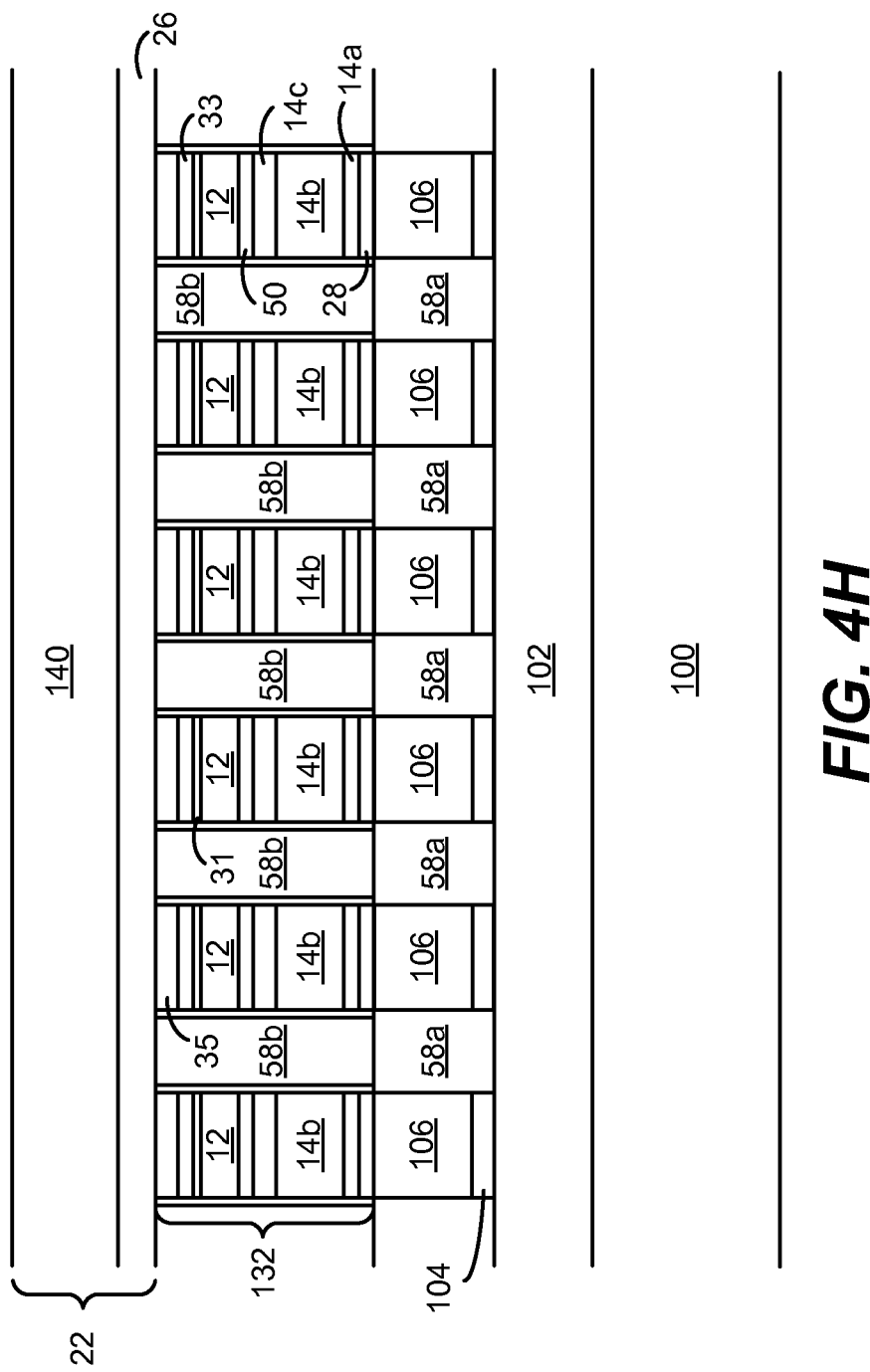

With reference to FIG. 4E, an anisotropic etch is used to remove lateral portions of dielectric liner 54, leaving only sidewall portions of dielectric liner 54 on the sides of pillars 132. For example, a sputter etch or other suitable process may be used to anisotropically etch liner 54. Sidewall dielectric liner 54 may protect the carbon material of carbon element 12 from damage during deposition of dielectric layer 58b (not shown in FIG. 4E), described below.

Next, a dielectric layer 58b is deposited over pillars 132 to gapfill between pillars 132. For example, approximately 2000-7000 angstroms of silicon dioxide may be deposited and planarized using CMP or an etchback process to remove excess dielectric layer material 58b to form a planar surface 136, resulting in the structure illustrated in FIG. 4F. During the planarization process, barrier layer 33 may be used as a CMP stop. Planar surface 136 includes exposed top surfaces of pillars 132 separated by dielectric material 58b (as shown). Other dielectric materials may be used for the dielectric layer 58b such as silicon nitride, silicon oxynitride, low K dielectrics, etc., and/or other dielectric layer thicknesses may be used. Exemplary low K dielectrics include carbon doped oxides, silicon carbon layers, or the like.

With reference to FIG. 4G, second conductors 22 may be formed above pillars 132 in a manner similar to the formation of first conductors 20. For example, in some embodiments, one or more barrier layers and/or adhesion layers 26 may be deposited over pillars 132 prior to deposition of a conductive layer 140 used to form second conductors 22.

Conductive layer 140 may be formed from any suitable conductive material such as tungsten, another suitable metal, heavily doped semiconductor material, a conductive silicide, a conductive silicide-germanide, a conductive germanide, or the like deposited by PVD or any other any suitable method (e.g., CVD, etc.). Other conductive layer materials may be used. Barrier layers and/or adhesion layers 26 may include titanium nitride or another suitable layer such as tantalum nitride, tungsten nitride, combinations of one or more layers, or any other suitable material(s). The deposited conductive layer 140 and barrier and/or adhesion layer 26 may be patterned and etched to form second conductors 22. In at least one embodiment, second conductors 22 are substantially parallel, substantially coplanar conductors that extend in a different direction than first conductors 20.

In other embodiments of the invention, second conductors 22 may be formed using a damascene process in which a dielectric layer is formed, patterned and etched to create openings or voids for conductors 22. The openings or voids may be filled with adhesion layer 26 and conductive layer 140 (and/or a conductive seed, conductive fill and/or barrier layer if needed). Adhesion layer 26 and conductive layer 140 then may be planarized to form a planar surface.

Following formation of second conductors 22, the resultant structure may be annealed to crystallize the deposited semiconductor material of diodes 14 (and/or to form silicide regions by reaction of the silicide-forming metal layer 52 with p+ region 14c). The lattice spacing of titanium silicide and cobalt silicide are close to that of silicon, and it appears that silicide layers 50 may serve as "crystallization templates" or "seeds" for adjacent deposited silicon as the deposited silicon crystallizes (e.g., silicide layer 50 enhances the crystalline structure of silicon diode 14 during annealing at temps of about 600-800° C.). Lower resistivity diode material thereby is provided. Similar results may be achieved for silicon-germanium alloy and/or germanium diodes.

Thus in at least one embodiment, a crystallization anneal may be performed for about 10 seconds to about 2 minutes in nitrogen at a temperature of about 600 to 800° C., and more preferably between about 650 and 750° C. Other annealing times, temperatures and/or environments may be used.

Persons of ordinary skill in the art will understand that alternative memory cells in accordance with this invention may be fabricated in other similar techniques. For example, memory cells may be formed that include reversible resistance switching element 12 below diode 14.

The foregoing description discloses only exemplary embodiments of the invention. Modifications of the above disclosed apparatus and methods which fall within the scope of the invention will be readily apparent to those of ordinary skill in the art. For instance, in any of the above embodiments, the carbon-based material may be located below the diodes 14. As stated, although the invention has been described primarily with reference to amorphous carbon, other carbon-based materials may be similarly used. Further, each carbon-based layer is preferably formed between two conducting layers such as titanium nitride or other barrier/adhesion layers to form a MIM stack in series with a steering element.

Accordingly, although the present invention has been disclosed in connection with exemplary embodiments thereof, it should be understood that other embodiments may fall within the spirit and scope of the invention, as defined by the following claims.

The invention claimed is:

1. A method of forming a memory cell, the method comprising:
    forming a carbon-based reversible resistance-switching material above a substrate;
    forming a carbon nitride layer above the carbon-based reversible resistance-switching material; and
    forming a barrier material above the carbon nitride layer using an atomic layer deposition ("ALD") process.

2. The method of claim 1, wherein the barrier material comprises any of titanium nitride, tungsten nitride and tantalum nitride.

3. The method of claim 1, wherein the ALD process comprises a first cycle and a second cycle.

4. The method of claim 3, wherein the first cycle comprises using a precursor comprising any of titanium, tungsten and tantalum.

5. The method of claim 3, wherein the first cycle is performed at a temperature of between about 300° C. and about 600° C.

6. The method of claim 3, wherein the first cycle is performed at a pressure of between about 0.1 Torr and about 10 Torr.

7. The method of claim 3, wherein the first cycle is performed at a precursor dose of between about 10 standard cubic centimeters per minute and about 500 standard cubic centimeters per minute.

8. The method of claim 3, wherein the second cycle comprises using a precursor comprising nitrogen.

9. The method of claim 3, wherein the second cycle is performed at a temperature of between about 300° C. and about 600° C.

10. The method of claim 3, wherein the second cycle is performed at a pressure of between about 0.1 Torr and about 10 Torr.

11. The method of claim 3, wherein the second cycle is performed at a precursor dose of between about 20 standard cubic centimeters per minute and about 1000 standard cubic centimeters per minute.

12. The method of claim 1, wherein the barrier material comprises a thickness of between about 20 angstroms to about 500 angstroms.

13. The method of claim 1, wherein forming the carbon nitride layer comprises using a plasma-enhanced chemical vapor deposition process to form the carbon nitride layer.

14. The method of claim 1, wherein forming the carbon nitride layer comprises exposing the carbon-based reversible resistance-switching material to a remote plasma comprising a nitrogen species.

15. The method of claim 1, wherein the carbon nitride layer comprises a thickness of between about 50 angstroms to about 300 angstroms.

16. The method of claim 1, wherein the carbon-based reversible resistance-switching material comprises any of amorphous carbon containing nanocrystalline graphene, graphene, graphite, carbon nano-tubes, and amorphous diamond-like carbon.

17. The method of claim 1, further comprising forming a steering element coupled to the carbon-based reversible resistance-switching material.

18. The method of claim 17, wherein the steering element comprises a p-n or p i n diode.

19. The method of claim 17, wherein the steering element comprises a polycrystalline diode.

20. A method of forming a memory cell, the method comprising:
    forming a layer of a carbon-based reversible resistance-switching material above a substrate;
    patterning and etching the layer of carbon-based reversible resistance-switching to form a pillar comprising a sidewall; and
    forming a conformal dielectric liner on the sidewall, wherein the conformal dielectric liner comprises boron.

21. The method of claim 20, wherein the conformal dielectric liner comprises a leakage current density of less than about $10^{-8}$ A/cm$^2$.

22. The method of claim 20, wherein the conformal dielectric liner comprises a breakdown voltage greater than about 5 MV/cm.

23. The method of claim 20, wherein the conformal dielectric liner comprises a breakdown voltage greater than about 8 MV/cm.

24. The method of claim 20, wherein the conformal dielectric liner comprises a thickness between about 100 angstroms to about 300 angstroms.

25. The method of claim 20, wherein the conformal dielectric liner comprises a thickness between about 100 angstroms to about 250 angstroms.

26. The method of claim 20, wherein forming the conformal dielectric liner comprises forming the dielectric liner by an atomic layer deposition ("ALD") process.

27. The method of claim 26, wherein the ALD process comprises a first cycle and a second cycle.

28. The method of claim 27, wherein the first cycle comprises using a precursor comprising boron.

29. The method of claim 27, wherein the first cycle is performed at a temperature of between about 400° C. and about 600° C.

30. The method of claim 27, wherein the first cycle is performed at a pressure of between about 0.1 Torr and about 10 Torr.

31. The method of claim 27, wherein the first cycle is performed at a precursor dose of between about 20 standard cubic centimeters per minute and about 500 standard cubic centimeters per minute.

32. The method of claim 27, wherein the second cycle comprises using a precursor comprising nitrogen.

33. The method of claim 27, wherein the second cycle is performed at a temperature of between about 400° C. and about 600° C.

34. The method of claim 27, wherein the second cycle is performed at a pressure of between about 0.1 Torr and about 10 Torr.

35. The method of claim 27, wherein the second cycle is performed at a precursor dose of between about 100 standard cubic centimeters per minute and about 2000 standard cubic centimeters per minute.

36. The method of claim 27, wherein the carbon-based reversible resistance-switching material comprises any of amorphous carbon containing nanocrystalline graphene, graphene, graphite, carbon nano-tubes, and amorphous diamond-like carbon.

37. The method of claim 20, further comprising forming a steering element coupled to the carbon-based reversible resistance-switching material.

38. The method of claim 37, wherein the steering element comprises a p-n or p i n diode.

39. The method of claim 37, wherein the steering element comprises a polycrystalline diode.

40. A method of forming a memory cell, the method comprising:
    forming a layer of a carbon-based reversible resistance-switching material above a substrate;
    forming a barrier material above the carbon-based reversible resistance-switching material without substantially damaging the carbon-based reversible resistance-switching material;
    patterning and etching the barrier material and the layer of carbon-based reversible resistance-switching material to form a pillar comprising a sidewall; and
    forming a conformal dielectric liner on the sidewall, wherein the conformal dielectric liner comprises a leakage current density of less than about $10^{-8}$ A/cm2 and a breakdown voltage greater than about 5 MV/cm.

41. The method of claim 40, wherein the barrier material comprises any of titanium nitride, tungsten nitride and tantalum nitride.

42. The method of claim 40, wherein forming the barrier material comprises using an atomic layer deposition process to form the barrier material.

43. The method of claim 40, wherein the barrier material comprises a thickness of between about 20 angstroms to about 500 angstroms.

44. The method of claim 40, further comprising forming a carbon nitride layer between the carbon-based reversible resistance-switching material and the barrier material.

45. The method of claim 44, wherein forming the carbon nitride layer comprises using a plasma-enhanced chemical vapor deposition process to form the carbon nitride layer.

46. The method of claim 44, wherein forming the carbon nitride layer comprises exposing the carbon-based reversible resistance-switching material to a remote plasma comprising a nitrogen species.

47. The method of claim 44, wherein the carbon nitride layer comprises a thickness of between about 50 angstroms to about 300 angstroms.

48. The method of claim 40, wherein the conformal dielectric liner comprises a breakdown voltage greater than about 8 MV/cm.

49. The method of claim 40, wherein the conformal dielectric liner comprises boron.

50. The method of claim 40, wherein the conformal dielectric liner comprises a thickness between about 100 angstroms to about 300 angstroms.

51. The method of claim 40, wherein the conformal dielectric liner comprises a thickness between about 100 angstroms to about 250 angstroms.

52. The method of claim 40, wherein forming the conformal dielectric liner comprises forming the conformal dielectric liner by an atomic layer deposition process.

53. The method of claim 40, wherein the carbon-based reversible resistance-switching material comprises any of amorphous carbon containing nanocrystalline graphene, graphene, graphite, carbon nano-tubes, and amorphous diamond-like carbon.

54. The method of claim 40, further comprising forming a steering element coupled to the carbon-based reversible resistance-switching material.

55. The method of claim 54, wherein the steering element comprises a p-n or p i n diode.

56. The method of claim 54, wherein the steering element comprises a polycrystalline diode.

* * * * *